(12) United States Patent
Lin et al.

(10) Patent No.: US 8,060,785 B2
(45) Date of Patent: Nov. 15, 2011

(54) METHOD FOR TUNING PARAMETERS IN MEMORY AND COMPUTER SYSTEM USING THE SAME

(75) Inventors: Chih-Shien Lin, Taipei (TW); Cheng-Hsun Li, Taipei (TW); Yi-Chun Tsai, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 32 days.

(21) Appl. No.: 12/795,632

(22) Filed: Jun. 7, 2010

(65) Prior Publication Data

US 2010/0318841 A1 Dec. 16, 2010

(30) Foreign Application Priority Data

Jun. 11, 2009 (TW) ................................ 98119590 A

(51) Int. Cl.
*G06F 11/00* (2006.01)

(52) U.S. Cl. ................. 714/36; 713/1; 713/2; 714/6.11; 714/25; 714/26

(58) Field of Classification Search .................. 713/1, 2; 714/6.11, 25, 26, 36
See application file for complete search history.

(56) References Cited

U.S. PATENT DOCUMENTS

| | | | | |
|---|---|---|---|---|
| 6,334,174 B1 * | 12/2001 | Delp et al. | ..................... | 711/167 |
| 6,453,434 B2 * | 9/2002 | Delp et al. | ..................... | 714/718 |
| 7,096,349 B1 * | 8/2006 | Hamilton | ........................... | 713/1 |
| 7,647,467 B1 * | 1/2010 | Hutsell et al. | .................. | 711/170 |
| 7,707,290 B2 * | 4/2010 | Bandholz et al. | ............. | 709/226 |
| 7,769,836 B2 * | 8/2010 | Bolay et al. | .................... | 709/221 |
| 2001/0003198 A1 * | 6/2001 | Wu | ................................ | 711/104 |
| 2002/0013881 A1 * | 1/2002 | Delp et al. | ..................... | 711/105 |
| 2004/0064686 A1 * | 4/2004 | Miller et al. | ....................... | 713/1 |
| 2006/0015776 A1 | 1/2006 | Lee | | |
| 2006/0106948 A1 * | 5/2006 | Ahmad et al. | ..................... | 710/3 |
| 2009/0077436 A1 * | 3/2009 | Lo et al. | ......................... | 714/718 |
| 2009/0307521 A1 * | 12/2009 | Lee et al. | ...................... | 713/601 |
| 2010/0115180 A1 * | 5/2010 | Lee et al. | ...................... | 711/103 |
| 2010/0191950 A1 * | 7/2010 | Lin et al. | ........................... | 713/2 |

FOREIGN PATENT DOCUMENTS

| | | |
|---|---|---|
| CN | 1797360 | 7/2006 |
| CN | 101359306 | 2/2009 |

* cited by examiner

*Primary Examiner* — Robert Beausoliel, Jr.
*Assistant Examiner* — Joshua P Lottich
(74) *Attorney, Agent, or Firm* — Jianq Chyun IP Office

(57) ABSTRACT

A method for tuning memory parameter values and a computer system using the same are disclosed. In the invention, the computer system provides an embedded controller which may accumulate a counting value and send a reset signal to reboot the computer system. Firstly, the embedded controller reloads a memory parameter value corresponding to the counting value. Then, the computer system executes a memory test procedure. When the memory test procedure successes, a BIOS stores the memory parameter value. On the contrary, when the memory test procedure fails, the embedded controller accumulates the counting value and sends the reset signal to reboot the computer system. The BIOS reloading another memory parameter value corresponding to the accumulated counting value and re-executes the memory test procedure.

18 Claims, 4 Drawing Sheets

METHOD FOR TUNING PARAMETERS IN MEMORY AND COMPUTER SYSTEM USING THE SAME

CROSS-REFERENCE TO RELATED APPLICATION

This application claims the priority benefit of Taiwan application serial no. 98119590, filed on Jun. 11, 2009. The entirety of the above-mentioned patent application is hereby incorporated by reference herein and made a part of specification.

BACKGROUND OF THE INVENTION

1. Field of the Invention

The invention relates to a method for tuning memory parameter values and, more particularly, to a method for automatically tuning memory parameter values in a computer system and the computer system using the same.

2. Description of the Related Art

Nowadays, there are multiple memories with different types and brands in the market. If the memory cooperates with a computer system with different brands (the brand of a motherboard it is different from that of the memory), the motherboard may be incompatible with the memory, and thus the computer system may not work stably, and even may crash.

To avoid this problem, if the memory is incompatible with the computer system, the user needs to tune the parameters for the specific the memory. In addition, the user needs to find proper testing procedures corresponding to different operating systems. Moreover, the user also needs relative knowledge for tuning the memory parameter values. Furthermore, the user needs to fully participate in tuning and testing, which is laborious and time-consuming. Moreover, repeated tuning and testing consume much research and development and validation resources, and if the user uses the memory with un-tuned parameters, the problem of incompatibility still exists.

BRIEF SUMMARY OF THE INVENTION

The invention discloses a computer system whose basic input/output system (BIOS) in a motherboard has a testing function. The user may set and tune memory parameter values even the operating system is not entered. Therefore, the memory and the computer system work more stably.

The invention discloses a method for tuning memory parameter values in a computer system. The invention provides a tuning function which may automatically tune parameter values in the memory, thereby simplifying manual procedures.

The invention discloses a computer system including a central processing unit (CPU), a basic input/output system (BIOS), an embedded controller and a memory. The BIOS is coupled to the CPU and the embedded controller. The BIOS provides a testing function for executing a memory test procedure and tuning the memory parameter values according to the testing result of the memory test procedure. The embedded controller accumulates a counting value and sends a reset signal to reboot the computer system. Detailedly, the BIOS retrieves the counting value from the embedded controller, selects the corresponding memory parameter values according to the reloaded counting value and executes the memory test procedure. When the memory test procedure successes, the BIOS stores the memory parameter values, and when the memory test procedure fails, the embedded controller accumulates the counting value and sends a reset signal to reboot the computer system, thereby making the BIOS reloading another memory parameter values corresponding to the accumulated counting value and re-execute the memory test procedure.

In an embodiment of the invention, the embedded controller includes a counting unit, a reset module and a monitoring module. The counting unit is used to accumulate a counting value. The reset module is used to send a reset signal to reboot the computer system. The monitoring module is coupled to the counting unit and the reset module for monitoring the memory test procedure to drive the counting unit and the reset module when the memory test procedure fails, thereby making the BIOS reloading the memory parameter values corresponding to the counting value and re-execute the memory test procedure.

In an embodiment of the invention, the monitoring module may be used to execute a boot monitoring procedure for monitoring a power on self test (POST) procedure in the memory test procedure and execute a memory stability monitoring procedure for monitoring the memory parameter stability test in the memory test procedure.

In an embodiment of the invention, the boot monitoring procedure in the computer system includes steps as follows. The monitoring module detects whether a boot success command is received in a boot waiting time. When the boot success command is received in the boot waiting time, the monitoring module stops executing the boot monitoring procedure. When the boot success command is not received in the boot waiting time, the counting unit and the reset module are driven to accumulate the counting value and send the reset signal to reboot the computer system, thereby making the BIOS reloading the memory parameter values and re-execute the memory test procedure.

In an embodiment of the invention, the memory stability monitoring procedure includes the steps as follows. The monitoring module detects whether the memory test state command is received in the test waiting time. When the test state command is not received in the test waiting time, the counting unit and the reset module are driven to accumulate the counting value and send the reset signal to reboot the computer system, thereby making the BIOS reloading the memory parameter values corresponding to the counting value and re-execute the memory test procedure. When the test state command is received in the test waiting time, the monitoring module determines the type of the test state command to further determine whether to store the memory parameter values.

In an embodiment of the invention, in the monitoring module, when the test state command is a pass command, the monitoring module stops the memory stability monitoring procedure. When the test state command is an error command, the counting unit and the reset module are driven. When the test state command is an in-testing command, the monitoring module continues executing the memory stability monitoring procedure.

In an embodiment of the invention, when the monitoring module determines that the memory test procedure successes, the counting unit is driven to clear the counting value by the monitoring module.

In an embodiment of the invention, the BIOS include a parameter table to record multiple parameter values and their corresponding counting values.

The invention discloses a method for tuning the memory parameter values adapted to tune the parameter values in the memory using BIOS. The method includes the steps as follows. An embedded controller is provided for accumulating the counting value and sending the reset signal to reboot the computer system. The parameter values corresponding to the counting value are reloaded. The memory test procedure is executed. The parameter values are stored when the memory test procedure successes. The counting value is accumulated and the reset signal is sent to reboot the computer system via the embedded controller when the memory test procedure fails, thereby making the BIOS reloading another parameter values corresponding to the accumulated counting value and re-execute the memory test procedure.

In an embodiment of the invention, the memory test procedure includes a POST procedure and a memory parameter stability test. The step of executing the memory test procedure includes executing the POST procedure, and executing the memory parameter stability test when the POST procedure successes, thereby storing the parameter values when the memory parameter stability test successes. When the POST procedure fails or the memory parameter stabilize test fails, the embedded controller accumulates the counting value and sends the reset signal to reboot the computer system to make the BIOS reloading another parameter values corresponding to the accumulated counting value and re-execute the memory test procedure.

In an embodiment of the invention, the step of executing the POST procedure includes informing the embedded controller to execute the boot monitoring procedure to detect whether the boot success command is received in the boot waiting time. If the boot success command is received, the boot monitoring procedure is stopped, and the memory stability monitoring procedure is executed. On the contrary, if the boot success command is not received, the embedded controller accumulates the counting value and sends the reset signal to reboot the computer system.

In an embodiment of the invention, the step of executing the memory parameter stability test includes informing the embedded controller to execute the memory stability monitoring procedure to detect whether the test state command is received in the test waiting time. If the test state command is not received, the embedded controller accumulates the counting value and sends the reset signal to reboot the computer system. On the contrary, if the test state command is received, the type of the test state command is determined to further determine whether to store the reloaded parameter values. When the test state command is the pass command, the embedded controller stops the memory stability monitoring procedure, and the BIOS is used to store the parameter values. When the test state command is the error command, the embedded controller accumulates the counting value and sends the reset signal to reboot the computer system. When the test state command is the in-testing command, the embedded controller continues executing the memory stability monitoring procedure.

In an embodiment of the invention, when the memory test procedure successes, the counting value is cleared, and the embedded controller is disabled.

Based on the above, the stableness of the memory parameter values is directly tested in the BIOS environment, and the most proper parameter values are tuned automatically to make the BIOS operates stably. This not only avoids the procedures in finding additional testing procedures, but also saves time for tuning the memory parameter values, which is very convenient.

These and other features, aspects and advantages of the present invention will become better understood with regard to the following description, appended claims, and accompanying drawings.

DETAILED DESCRIPTION OF THE EMBODIMENTS

The First Embodiment

Figure 1:
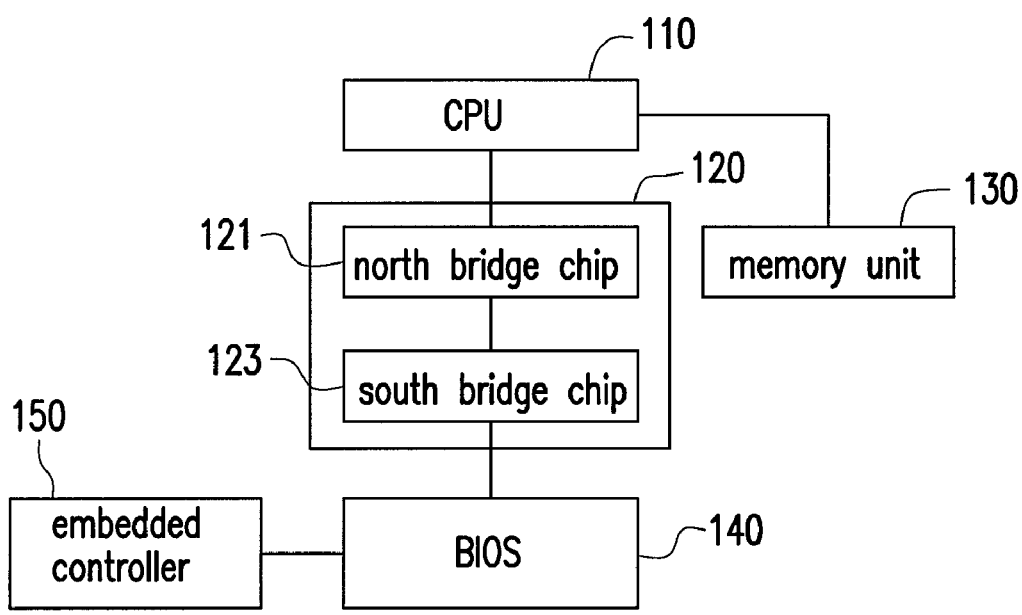
FIG. 1 is a block diagram showing the computer system in the first embodiment of the invention.

FIG. 1 is a block diagram showing the computer system in the first embodiment of the invention. As shown in FIG. 1, the computer system includes a CPU 110, a control chipset 120, a memory 130, a BIOS 140 and an embedded controller 150. The control chipset 120 is usually composed of a north bridge chip 121 and a south bridge chip 123. The north bridge chip 121 is coupled between the CPU 110 and the south bridge chip 123, and the south bridge chip 123 is coupled to the BIOS 140. The north bridge chip 121 is used to receive commands sent by the CPU 110, and the south bridge chip 123 is used to control the peripherals.

In the embodiment, the BIOS 140 is connected to the control chipset 120 composed of the south bridge chip 123 and the north bridge chip 121, and it is coupled to the embedded controller 150 via a low pin count (LPC) bus, a serial peripheral interface (SPI) bus, a system management bus (SMB) or a general purpose input/output (GPIO) bus. The BIOS 140 has a testing function to load parameter values of the memory, perform the memory test procedure, and tune the memory parameter values 130 according to the testing result of the memory test procedure.

The embedded controller 150 is used to accumulate the counting value and send the reset signal to reboot the computer system, thereby making the BIOS 140 tune the memory parameter values 130. The BIOS 140 may have a parameter table for recording multiple memory parameter values and the corresponding counting values.

For example, the memory 130 usually has four main parameters including a column address strobe latency (tCL), a row address strobe to column address strobe (RAS-to-CAS) Delay (tRCD), a RAS precharge time (tRP) and a RAS active to precharge time (tRAS). In the parameter table, each counting value corresponds to a group of parameter values (for example, tCL value, tRCD value, tRP value and tRAS value), and the BIOS 140 may import a group of parameter values from the parameter table according to the retrieved counting values.

Detailedly, the BIOS 140 retrieves the counting value in the counting unit from the embedded controller 150 to import the corresponding memory parameter values from the parameter table according to the counting value, and then executes the memory test procedure. When the BIOS 140 executes the memory test procedure, the embedded controller 150 monitors the BIOS 140, thereby accumulating the counting value and sending the rest signal to reboot the computer system when the BIOS 140 fails to execute the memory test procedure, Therefore, the BIOS 140 may import another group of memory parameter values to re-execute the memory test procedure according to the accumulated counting value. In another aspect, when the memory test procedure successes, the BIOS 140 stores the reloaded memory parameter values.

Figure 2:
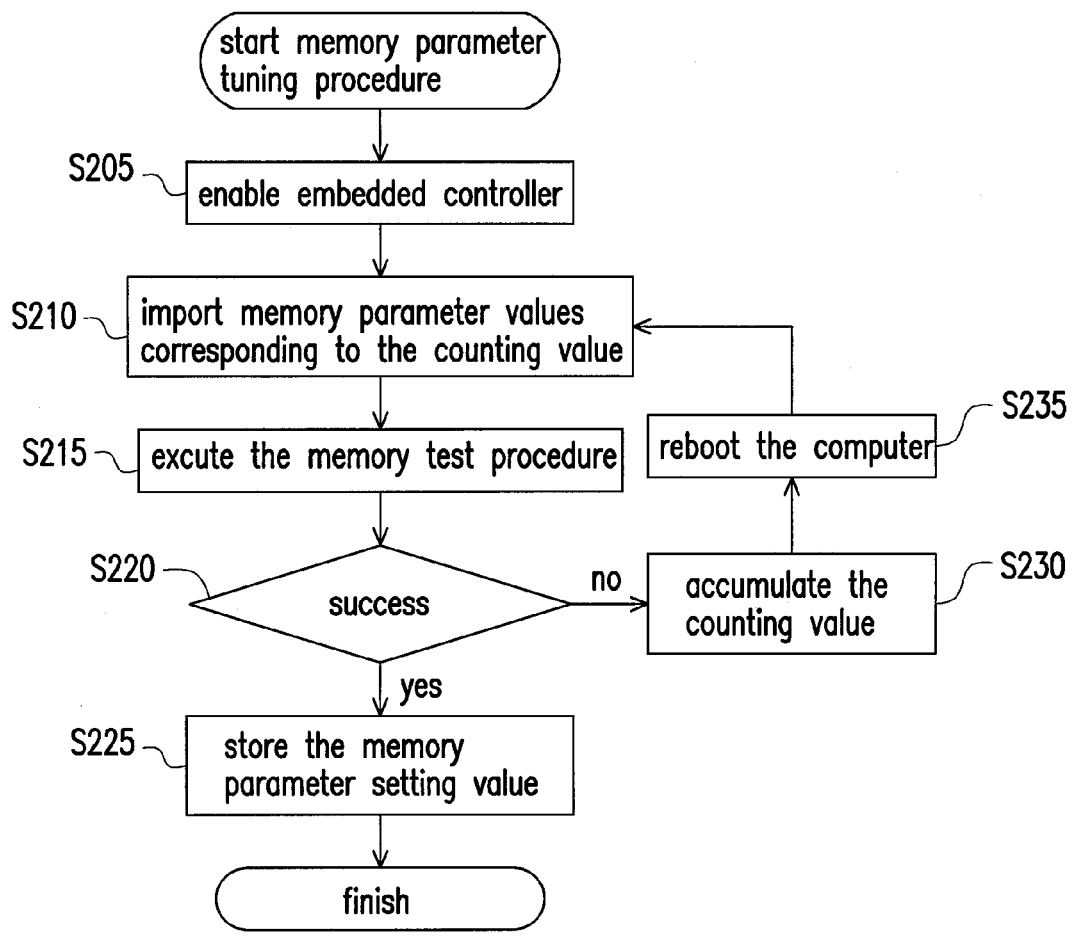
FIG. 2 is a flow chart diagram showing the method for tuning the parameter in the first embodiment of the invention.

The method and steps for tuning the memory parameter values in the computer system are illustrated hereinafter. FIG. 2 is a flow chart diagram showing the method for tuning the parameters in the first embodiment of the invention. In the embodiment, an option (such as "auto tune memory") may be set in a menu of the BIOS 140 for allowing the user to enable a memory parameter tuning procedure. When the option "memory auto tune" is enabled, the BIOS 140 enters a memory parameter tuning procedure.

As shown in FIG. 1 and FIG. 2, when the BIOS 140 starts the memory parameter tuning procedure, as shown in step S205, the BIOS 140 enables the embedded controller 150. The embedded controller 150 is used to accumulate the counting value. For example, the initial value of the counting value is 0, and after starting the memory parameter tuning procedure, the embedded controller 150 adding 1 to the counting value.

Then, in step S210, the BIOS 140 reloads the memory parameter values corresponding to the counting value. Detailedly, the BIOS 140 retrieves the counting value (such as 1) from the embedded controller 150, and then searches for the memory parameter values corresponding to the counting value 1 from the parameter table to import the memory parameter values.

Then, in step S215, the BIOS 140 is used to execute the memory test procedure. Before executing the memory test procedure, the BIOS 140 informs the embedded controller 150 to monitor the memory test procedure. Then, as shown in step S215, the BIOS 140 executes the memory test procedure. Afterwards, in step S220, the embedded controller 150 is used to monitor whether the memory test procedure successes.

When the memory test procedure successes, it means that the memory parameter values make the system work stably. Therefore, as shown in step S225, the BIOS 140 stores the memory parameter values in the memory such as a complementary metal oxide semiconductor (CMOS). On the contrary, when the memory test procedure fails, it means that the memory parameter values do not fit the system, and then as shown in step S230, the embedded controller 150 accumulates the counting value. Afterwards, in step S235, the embedded controller 150 sends the reset signal to reboot the computer system. Then, back to step S210, the BIOS 140 re-retrieves the counting value from the embedded controller 150, reloading the memory parameter values corresponding to the accumulated counting value and re-executes step S215 until the memory test procedure successes. As a result, according to step S205 to step S235, the memory parameter values in the memory are tuned automatically.

The Second Embodiment

Figure 3:
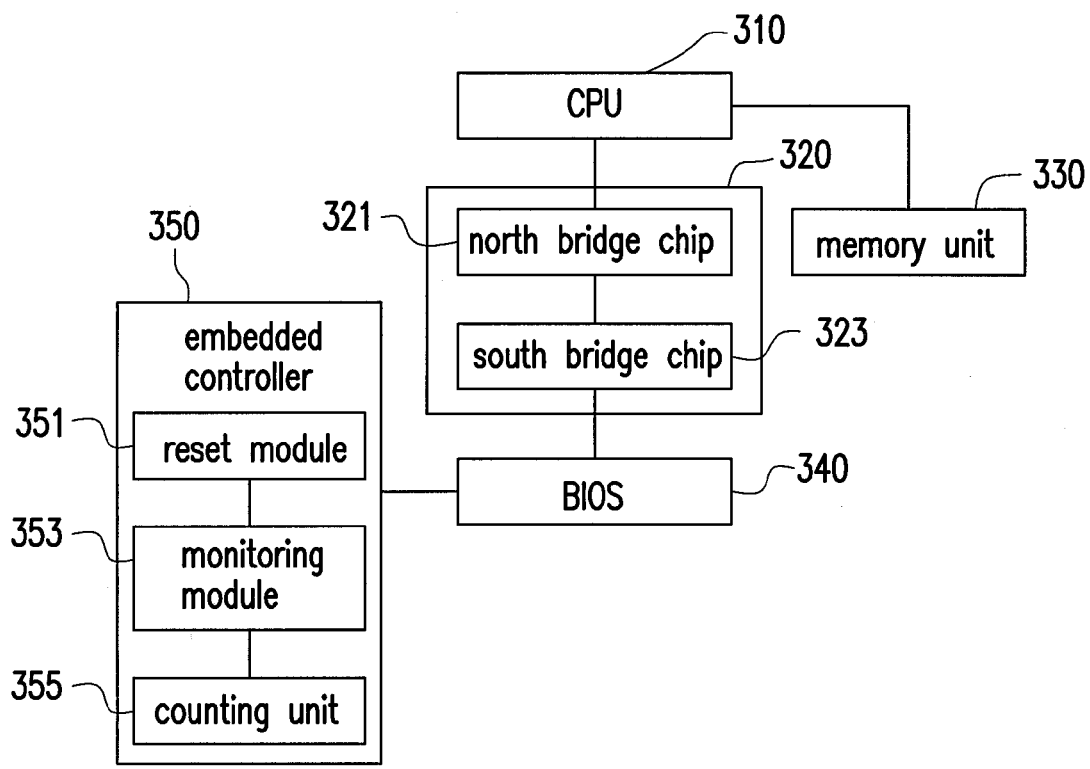
FIG. 3 is a block diagram showing the computer system in the second embodiment of the invention.

FIG. 3 is a block diagram showing the computer system in the second embodiment of the invention. As shown in FIG. 3, in the embodiment, the computer system includes a CPU 310, a control chipset 320 composed of a north bridge chip 321 and a south bridge chip 323, a memory 330, a BIOS 340 and an embedded controller 350. The connecting relations and functions of the CPU 310, the control chipset 320, the memory 330, the BIOS 340 and the embedded controller 350 are the same or similar as those of the CPU 110, the control chipset 120, the memory 130, the BIOS 140 and the embedded controller 150, and they are not illustrated herein for a concise purpose. In the embodiment, the embedded controller 350 includes a reset module 351, a monitoring module 353 and a counting unit 355. The monitoring module 353 is coupled to the counting unit 355 and the reset module 351, respectively.

The reset module 351 is used to send the reset signal to reboot the computer system. The counting unit 355 is used to accumulate the counting value. The monitoring module 353 is used to monitor that the BIOS 340 executes the memory test procedure, and thus it drives the counting unit 355 and the reset module 351 when the memory test procedure fails, thereby making the BIOS reloading the memory parameter values corresponding to the accumulated counting value and re-execute the memory test procedure.

Detailedly, in the embodiment, the monitoring module 353 may execute the boot monitoring procedure and the memory stability monitoring procedure. The boot monitoring procedure is used to monitor the POST procedure, and the memory stability monitoring procedure is used to monitor the memory parameter stability test. The memory parameter stability test procedure is built in the BIOS 340. For example, the test may be performed via a series of access actions to the memory 330.

Generally, during the booting procedure, the BIOS 140 starts to execute the POST procedure, and the main task of the POST procedure is to test whether the key equipments in the system, such as the memory 130, the graphics card (not shown) and the hard disk (not shown) work normally. That is, in the embodiment, only after the POST procedure works normally, the memory parameter stability test is executed.

Figure 4:
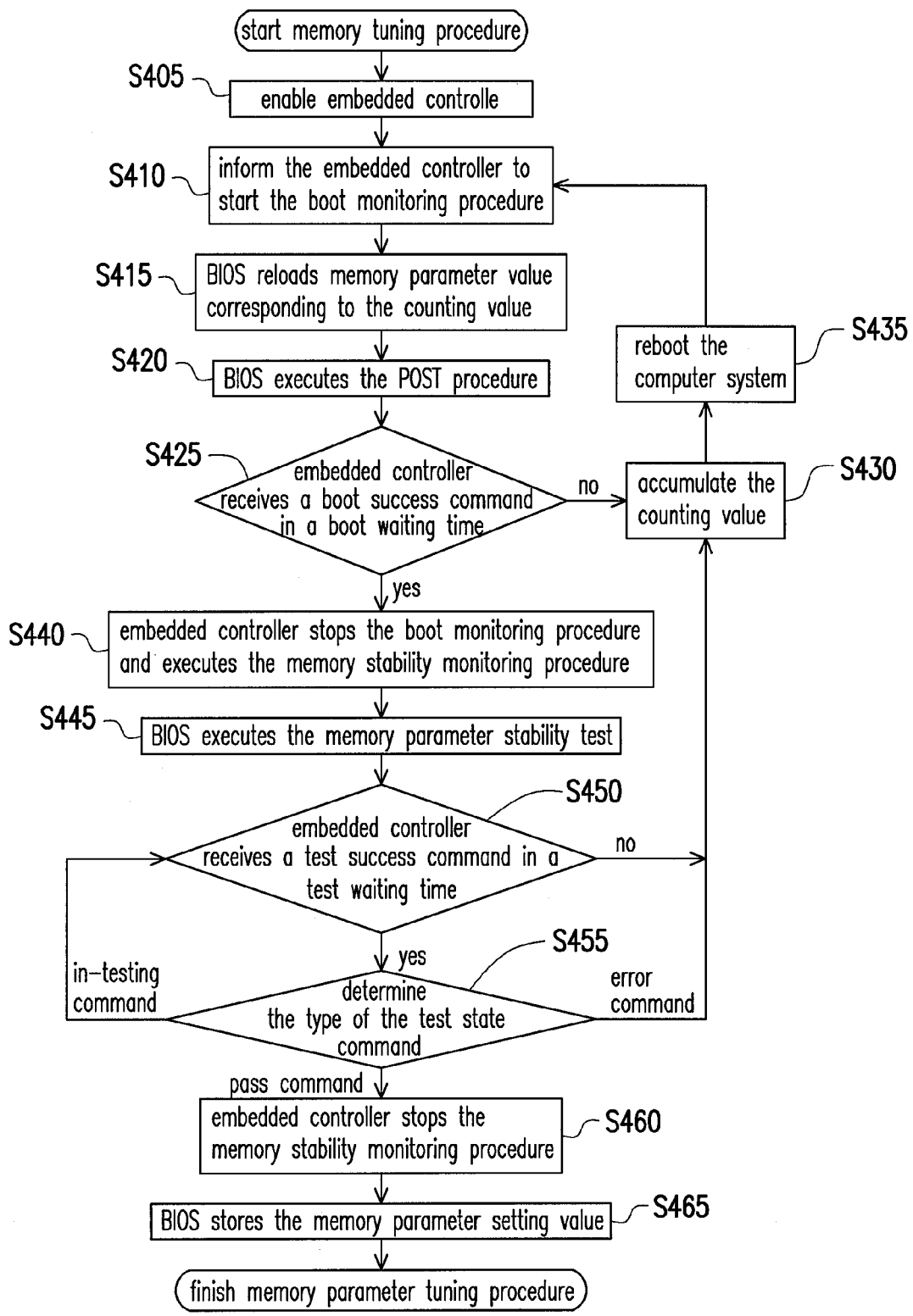
FIG. 4 is a flow chart diagram showing the method for tuning the parameter in the second embodiment of the invention.

The method and steps for tuning the memory parameter values in the computer system are illustrated herein. FIG. 4 is a flow chart diagram showing the method for tuning the parameter in the second embodiment of the invention. In the embodiment, the BIOS 340 has an option in a menu to allow the user to enable the memory parameter tuning procedure.

As shown in FIG. 3 and FIG. 4, after the BIOS 340 starts to tune the memory parameter values, as shown in step S405, the BIOS 340 enables the embedded controller 350 to start accumulating the counting value by the counting unit 355.

Then, in step S410, the BIOS 340 informs the embedded controller 350 that a memory parameter tuning procedure is executed, and the monitoring module 353 starts the boot monitoring procedure. Afterwards, in step S415, the BIOS 340 retrieves the counting value of the counting unit 355 to import the memory parameter values corresponding to the counting value.

Afterwards, in step S420, the BIOS 340 starts to execute the POST procedure. The monitoring module 353 monitors the POST procedure via the boot monitoring procedure. The boot monitoring procedure is shown in S425, and the embedded controller 350 detects whether the boot success command is received from the BIOS 340 in the boot waiting time (such as 30 seconds).

If the monitoring module 353 receives the boot success command from the BIOS 340 in 30 seconds (the boot waiting time), step S440 is performed. On the contrary, if the monitoring module 353 does not receive the boot success command from the BIOS 340 after 30 seconds, it means that the memory parameter values make the computer crash in the POST procedure, and thus step S430 is performed. The monitoring module 353 drives the counting unit 355 to accumulate the counting value. Afterwards, as shown in step S435, the monitoring module 353 drives the reset module 351 to send a reset signal to reboot the computer system. Then, back to step S410, and step S410 to S425 are re-executed until the reloaded memory parameter values make the BIOS execute the POST procedure successfully.

After the POST procedure successes, the BIOS 340 automatically sends a boot success command to the embedded controller 350 to inform the embedded controller 350 to execute the memory stability monitoring procedure. As shown in step S440, the embedded controller 350 stops the boot monitoring procedure via the monitoring module 353 and executes the memory stability monitoring procedure.

In step S445, the BIOS 340 executes the memory parameter stability test. For example, a memory parameter stability test procedure is built in the BIOS 340, and thus the memory 330 is accessed to test the stability of the memory parameter values. When the BIOS 340 executes the memory parameter stability test, the BIOS 340 sends a test state command continuously to the embedded controller 350 to inform the embedded controller 350 the current test state via the test state command. For example, the BIOS 340 sends the test state command every second.

The embedded controller 350 executes the memory stability monitoring procedure via the monitoring module 353 to monitor that the BIOS 340 executes the memory parameter stability test. The memory stability monitoring procedure is shown in step S450, and the embedded controller 350 detects whether the test state command is received from the BIOS 340 in the test waiting time (such as ten seconds) via the monitoring module 353. That is because the BIOS 340 sends a test state command to the embedded controller 350 at a certain time interval, and if the embedded controller 350 does not receive the test state command in ten seconds, it means that the current memory parameter values are not proper, and the system may crash at the moment. Then, step S430 and S435 are performed, the counting value is accumulated by the counting unit 355, and the reset signal is sent via the rest module 351 to reboot the computer system, and thus the BIOS 340 reloading the memory parameter values and re-performs step S410.

If the monitoring module 353 receives the test state command in the test waiting time, as shown in step S455, the monitoring module 353 is used to determine the type of the test state command. The test state command may be a pass command, the error command or an in-testing command. Detailedly, when the memory parameter stability test is finished, the BIOS 340 sends the pass command, and when the memory parameter stability test has an error (that is, the current memory parameter values are not proper), the BIOS 340 may send the error command. In addition, when the memory parameter stability test is executed continuously, the BIOS 340 sends an in-testing command.

Therefore, if the embedded controller 350 receives the in-testing command, it means that the BIOS 340 still executes the memory parameter stability test, and it backs to S450. The embedded controller 350 continues executing the memory stability monitoring procedure via the monitoring module 353.

In addition, if the embedded controller 350 receives the error command, step S430 and step S435 are performed. The counting unit 355 is used to accumulate the counting value and send the reset signal to reboot the computer system via the reset module 351, thereby making the BIOS reloading the new memory parameter values and re-execute the step S410.

In addition, if the embedded controller 350 receives the pass command, as shown in step S460, the embedded controller 350 stops the memory stability monitoring procedure via the monitoring module 353. Then, as shown in step S465, the BIOS 340 stores the current memory parameter values, and the embedded controller 350 clears the counting value via the counting unit 355. Afterwards, the BIOS 340 disables the memory parameter tuning procedure and the embedded controller 350. Therefore, the memory parameter tuning procedure is not executed in the next booting procedure.

To sum up, in the invention, the testing function is built in the BIOS, and the BIOS is directly used to tune the memory parameter values of the memory without additional testing procedures. In addition, the memory test procedure may also be executed without entering the operating system, which is more convenient in usage. Furthermore, the BIOS may tune the parameter values in the memory automatically until the most proper memory parameter values are found, and the time in tuning parameters is saved.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A computer system comprising:
a central processing unit (CPU);
a basic input/output system (BIOS) coupled to the CPU, wherein the BIOS includes a testing function for executing a memory test procedure and tunes a memory parameter value according to the testing result of the memory test procedure; and
an embedded controller coupled to the BIOS for accumulating a counting value and sending a reset signal to reboot the computer system; and
a memory connected to the CPU;
wherein the BIOS retrieves the counting value from the embedded controller to import the memory parameter value corresponding to the counting value and executes the memory test procedure; if the memory test procedure succeeds, the BIOS stores the memory parameter value, and if the memory test procedure fails, the embedded controller accumulates the counting value and sends the reset signal to reboot the computer system, thereby making the BIOS reload another memory parameter value corresponding to the accumulated counting value and re-execute the memory test procedure.

2. The computer system according to claim 1, wherein the embedded controller comprises:
a counting unit for accumulating the counting value;
a reset module for sending the reset signal to reboot the computer system; and
a monitoring module coupled to the counting unit and the reset module, wherein the monitoring module is used for monitoring the memory test procedure to drive the counting unit and the reset module when the memory test procedure fails, thereby making the BIOS reload another memory parameter value corresponding to the accumulated counting value and re-execute the memory test procedure.

3. The computer system according to claim 2, wherein the monitoring module is used for executing a boot monitoring procedure to monitor a power-on self-test (POST) procedure and execute a memory stability monitoring procedure for monitoring a memory parameter stability test in the memory test procedure.

4. The computer system according to claim 3, wherein the boot monitoring procedure comprises:
detecting whether a boot success command is received during a boot waiting time via the monitoring module;
stopping executing the boot monitoring procedure via the monitoring module when the boot success command is received in the boot waiting time; and driving the counting unit and the reset module to accumulate the counting value and send the reset signal to reboot the computer system when the boot success command is not received during the boot waiting time, thereby making the BIOS reload another memory parameter value corresponding to the accumulated counting value and re-execute the memory test procedure.

5. The computer system according to claim 3, wherein the memory stability monitoring procedure comprises:
detecting whether a test state command is received during a test waiting time via the monitoring module;
driving the counting unit and the reset module to accumulate the counting value and send the reset signal to reboot the computer system when the test state command is not received during the test waiting time, thereby making the BIOS reload another memory parameter value corresponding to the counting value and re-execute the memory test procedure; and
determining the type of the test state command via the monitoring module to determine whether to store the memory parameter value or not when the test state command is received during the test waiting time.

6. The computer system according to claim 5, when the test state command is a pass command, the monitoring module stops the memory stability monitoring procedure;
when the test state command is an error command, the monitoring module drives the counting unit and the reset module to make the BIOS reload another memory parameter value corresponding to the accumulated counting value; and
when the test state command is an in-testing command, the monitoring module continues executing the memory stability monitoring procedure.

7. The computer system according to claim 2, when the monitoring module determines that the memory test procedure succeeds, the monitoring module further drives the counting unit to clear the counting value.

8. The computer system according to claim 1, wherein the BIOS comprises a parameter table for recording multiple memory parameter values and their corresponding counting values.

9. A method for tuning memory parameter values, adapted to tune a memory parameter value of a memory using a BIOS, the method comprising:
providing an embedded controller for accumulating a counting value and sending a reset signal to reboot a computer system;
importing the memory parameter value corresponding to the counting value;
executing a memory test procedure;
storing the memory parameter value when the memory test procedure succeeds; and
accumulating the counting value and sending the reset signal to reboot the computer system via the embedded controller when the memory test procedure fails, thereby making the BIOS reloading another memory parameter value corresponding to the accumulated counting value and re-execute the memory test procedure.

10. The method for tuning memory parameter values according to claim 9, wherein the memory test procedure includes a POST procedure and a memory parameter stability test, and the memory test procedure comprises:
executing the POST procedure;
executing the memory parameter stability test when the POST procedure succeeds;
accumulating the counting value and sending the reset signal to reboot the computer system via the embedded controller when the memory parameter stability test fails, thereby making the BIOS reload another memory parameter value corresponding to the accumulated counting value and re-execute the memory test procedure; and
storing the memory parameter value when the memory parameter stability test succeeds.

11. The method for tuning the memory parameter values according to claim 10, when the POST procedure fails, the embedded controller accumulates the counting value and sends the reset signal to reboot the computer system, thereby making the BIOS reload another memory parameter value corresponding to the accumulated counting value and re-execute the memory test procedure.

12. The method for tuning the memory parameter values according to claim 10, wherein the step of executing the POST procedure comprises:
informing the embedded controller to execute a boot monitoring procedure, wherein the boot monitoring procedure includes:
detecting whether a boot success command is received during a boot waiting time by the embedded controller;
stopping executing the boot monitoring procedure via the embedded controller when the boot success command is received during the boot waiting time; and
accumulating the counting value and sending the reset signal to reboot the computer system via the embedded controller when the boot success command is not received during the boot waiting time, thereby making the BIOS reload another memory parameter value corresponding to the accumulated counting value and re-execute the memory test procedure.

13. The method for tuning the memory parameter values according to claim 10, wherein the step of executing the memory parameter stability test comprises:
informing the embedded controller to execute a memory stability monitoring procedure, and the memory stability monitoring procedure includes:
detecting whether a test state command is received during a test waiting time by the embedded controller;
accumulating the counting value and sending the reset signal to reboot the computer system via the embedded controller when the test state command is not received in the test waiting time, thereby making the BIOS reload another memory parameter value corresponding to the accumulated counting value and re-execute the memory test procedure; and
determining the type of the test state command to determine whether to store the memory parameter value or not when the test state command is received during the test waiting time.

14. The method for tuning the memory parameter values according to claim 13, when the test state command is an error command, the embedded controller accumulates the counting value and sends the reset signal to reboot the computer system, thereby making the BIOS reload another memory parameter value corresponding to the accumulated counting value.

15. The method for tuning the memory parameter values according to claim 13, when the test state command is a pass command, the embedded controller stops the memory stability monitoring procedure, and the BIOS stores the memory parameter value.

16. The method for tuning the memory parameter values according to claim 13, when the test state command is an in-testing command, the embedded controller continues executing the memory stability monitoring procedure.

17. The method for tuning the memory parameter values according to claim 9, when the memory test procedure succeeds, the step further comprises clearing the counting value and disabling the embedded controller.

18. The method for tuning the memory parameter values according to claim 9, further comprising:
providing a parameter table to record the memory parameter values and the corresponding counting values.

* * * * *